United States Patent [19]  [11]  4,319,258
Harnagel et al. [45] Mar. 9, 1982

[54] SCHOTTKY BARRIER PHOTOVOLTAIC DETECTOR

[75] Inventors: Gary L. Harnagel, La Verne; Gerry T. Laga, Placentia; Joseph M. Harrison, San Dimas, all of Calif.; Victor A. Twaddell, Fairport, N.Y.

[73] Assignee: General Dynamics, Pomona Division, Pomona, Calif.

[21] Appl. No.: 128,325

[22] Filed: Mar. 7, 1980

[51] Int. Cl.³ .............................................. H01L 29/48
[52] U.S. Cl. ...................................... 357/15; 357/30; 357/71
[58] Field of Search ............................ 357/30, 15, 71

[56] References Cited

U.S. PATENT DOCUMENTS

| | | | |
|---|---|---|---|
| 2,688,564 | 9/1954 | Forgue | 117/32.21 |
| 2,820,841 | 1/1958 | Carlson | 136/89 |
| 2,844,640 | 7/1958 | Reynolds | 136/89 |
| 3,146,138 | 8/1964 | Shirland | 148/187 |
| 3,284,252 | 11/1966 | Grimmeiss | 148/188 |
| 3,386,894 | 1/1968 | Steppat | 357/71 X |
| 3,571,915 | 3/1971 | Shirland | 29/572 |
| 3,577,631 | 5/1971 | Bylander | 29/572 |
| 3,597,270 | 8/1971 | Monck et al. | 117/217 |
| 3,737,701 | 6/1973 | Haberechts | 313/66 |
| 3,858,304 | 1/1975 | Leedy | 29/528 |
| 3,888,697 | 6/1975 | Bogus et al. | 136/89 |
| 3,980,915 | 9/1976 | Chapman | 313/101 |
| 4,000,502 | 12/1976 | Butler | 375/15 |
| 4,001,858 | 1/1977 | Ballamy | 357/15 X |
| 4,016,643 | 4/1977 | Paul | 29/571 |

FOREIGN PATENT DOCUMENTS 2444490 1/1976 Fed. Rep. of Germany .

OTHER PUBLICATIONS

*Electronic Design*, Oct. 20, 1967, p. 40.
*Electronic Letters*, Aug. 4, 1977, vol. 13, No. 16., p. 472.
Lacombe et al., *Electronic Letters*, vol. 13, No. 15, Aug. 4, 1977.

*Primary Examiner*—Martin H. Edlow
*Attorney, Agent, or Firm*—Neil F. Martin; Michael H. Jester; Edward B. Johnson

[57] ABSTRACT

A platinum-cadmium sulfide Schottky barrier photovoltaic detector which is capable of sensing near ultraviolet and short wavelength visible radiation with extremely small response to wavelengths longer than about 5200 angstroms. The detector is fabricated with both the ohmic and barrier contacts located on the same side of the cadmium sulfide substrate to facilitate wire attachment by high-speed bonding techniques. A titanium-gold-titanium infrared shield structure is deposited directly on the substrate and is utilized to provide a connection between the ohmic contact and the substrate. An insulating layer of silicon dioxide covers the shield structure. A thin layer of platinum is deposited directly on the substrate in a small central optically active area surrounded by the insulated shield structure. A metal boundary layer overlies the periphery of the platinum layer and prevents the barrier contact metalization from affecting the properties of the Schottky barrier. Both the ohmic and barrier contacts may be formed of a titanium adhesive layer and a layer of gold. The gold portions of these contacts touch the shield structure and the boundary layer through separate windows etched in the silicon dioxide insulating layer.

6 Claims, 21 Drawing Figures

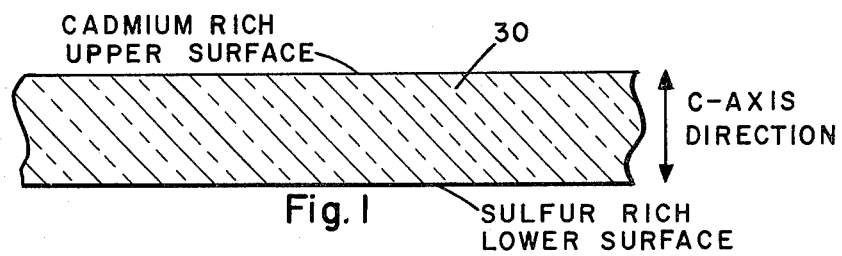
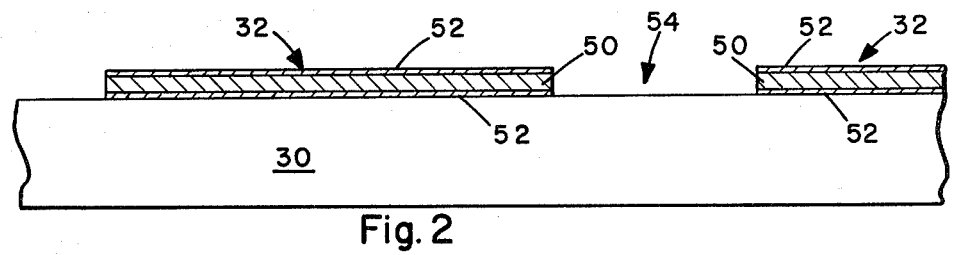
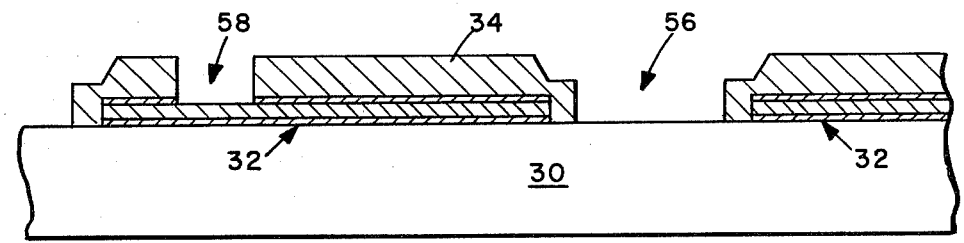
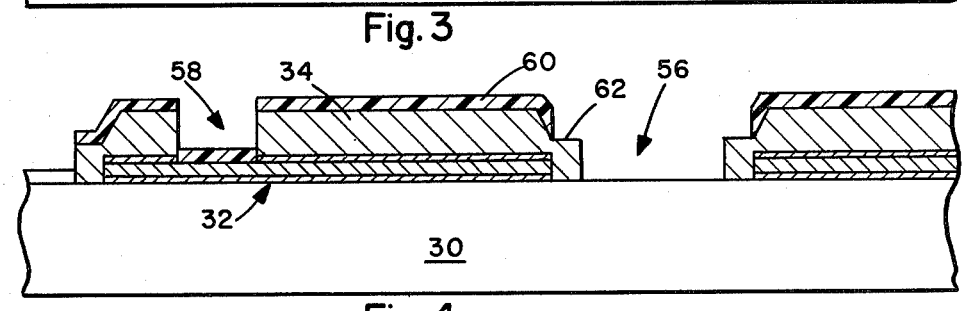
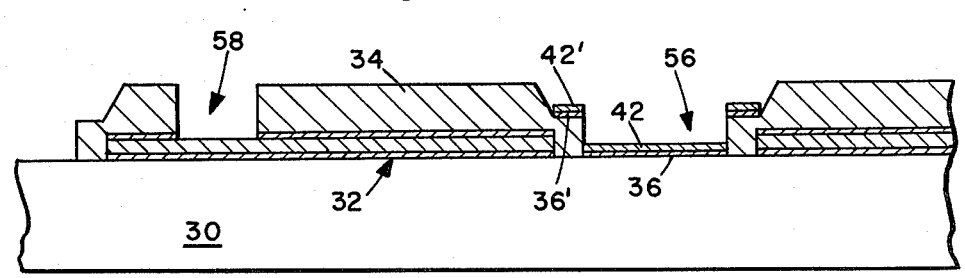

SCHOTTKY BARRIER PHOTOVOLTAIC DETECTOR

BACKGROUND OF THE INVENTION

The present invention relates to solid state radiation detectors and processes of manufacturing the same. More particularly, the present invention relates to an improved platinum-cadmium sulfide Schottky barrier photovoltaic detector and process of fabrication.

There exists a demand in high technology optical systems, such as in the optical guidance systems for radiation seeking missiles, for a high quantum efficiency, short-time response, solid state radiation detector. In these systems, such a detector must have a high response to near ultraviolet (UV) radiation, but must be substantially insensitive to radiation in the visible spectrum.

Silicon photodiodes have been proposed for these applications. However, such photodiodes are sensitive to the visible spectrum through approximately 8000 angstroms, and therefore they must be used in association with optical filtering to remove the visible radiation. Additionally, these detector-filter combinations have a relatively low quantum efficiency, e.g. 30% or less.

Cadmium sulfide based solid state radiation detectors have been utilized; however, the known characteristics of cadmium sulfide detectors suggest that they are useful primarily in visible range, and that they are relatively insensitive to ultraviolet radiation. It is desirable to provide a solid state radiation detector sensitive to near ultraviolet and short wavelength visible radiation and transparent to infrared radiation. This is particularly true if such a detector can be fabricated to have a high quantum efficiency and a relatively small optically active area so that it may be utilized in conjunction with the high resolution optics. Good infrared (IR) transmission characteristics enable the detector to be utilized in association with an IR sensor to produce a coaxial transducer suitable for use in association with unfiltered, high-resolution optics.

Recently cadmium sulfide based Schottky barrier diodes have been proposed as radiation detectors. Broadly speaking, a Schottky barrier diode is a junction diode in which the junction is formed between a semiconductor material and a metal contact, rather than between dissimilar semiconductor materials or carrier types, as in the case of an ordinary PN diode. The present invention constitutes an improvement over that disclosed in U.S. Pat. No. 4,000,502 owned by the assignee of the present application. Where applicable, the disclosure of that patent is specifically incorporated herein by reference. Disclosed therein is a platinum-cadmium sulfide Schottky barrier photovoltaic detector fabricated with the ohmic and barrier contacts located on the opposite sides of the cadmium sulfide substrate. This patented detector exhibits high quantum efficiency in the UV spectrum with good IR transmission characteristics.

The improved detector of the present invention is more amenable to production fabrication and quantity assembly techniques than the detector of U.S. Pat. No. 4,000,502. Rather than having ohmic and barrier contact connections on opposite sides of the device, the new detector is fabricated with both contacts on the front face. Organic insulating layers made of photoresist have been replaced by a hard, inorganic insulating layer. Furthermore, the copper and indium metalizations have been replaced with gold, titanium, nichrome and other metallizations. These improvements facilitate wire attachment by high-speed bonding techniques which are more reliable and which reduce the time and effort necessary for forming electrical contacts on the device. Furthermore, the overall reliability of the device is enhanced. The manufacturing process results in a compensated layer at the surface of the cadmium sulfide substrate which protects the device when excessive voltage is applied to it.

SUMMARY OF THE INVENTION

It is therefore an object of the present invention to provide an improved solid state radiation detector and process of manufacturing the same.

It is another object of the present invention to provide an improved platinum-cadmium sulfide Schottky barrier photovoltaic detector and process of manufacturing the same.

It is another object of the present invention to produce a detector of the aforementioned character which is capable of sensing near ultraviolet and short wavelength visible radiation while being substantially insensitive to wavelengths longer than about 5200 angstroms.

It is still another object of the present invention to provide a detector having a very small optical area with the aforementioned sensitivity which is highly transparent to infrared radiation in order that it may be used in an ultraviolet detector/infrared sensor sandwich configuration.

A still further object of the present invention is to provide an improved platinum-cadmium sulfide Schottky barrier photovoltaic detector which is more amenable to quantity assembly methods including wire attachment by high-speed bonding techniques.

A still further object of the present invention is to provide a detector of the aforementioned type which is less subject to failure.

It is another object of the present invention to produce a radiation detector with increased quantum efficiency in the UV spectrum.

Yet another object of the present invention is to provide a new and improved detector of the aforementioned type with a fast reaction time, i.e. a short time constant.

Finally, it is an object of the present invention to provide a process for fabricating an improved detector that will achieve the aforementioned objects.

According to one embodiment of the present invention, an infrared shield structure is first formed on the top surface of a polished, damaged-free cadmium sulfide substrate. It is preferably composed of a layer of gold (approximately 1500 angstroms thick) which is opaque to infrared radiation, sandwiched between two thin layers of titanium (approximately 300 angstroms thick). The titanium layers serve as bonding agents. The infrared shield structure is delineated in a generally square pattern leaving exposed a small central portion of the substrate which forms the optically active area. A relatively thick layer of silicon dioxide (preferably approximately 5000 angstroms thick) covers the infrared shield structure to prevent the shorting of subsequent layers deposited thereon. Two windows are etched in the silicon dioxide insulating layer, one coinciding with the central optically active area of the substrate, and the other to the side of this area which later receives the ohmic contact.

The Schottky barrier metallization is preferably a very thin layer of platinum deposited directly on the substrate and which completely fills the central window in the silicon dioxide layer. A boundary layer preferably made of a metal such as tungsten, nichrome or gold overlies the periphery of the platinum layer and prevents the barrier contact metallization from affecting the properties of the Schottky barrier.

The barrier contact metallization is preferably composed of a titanium adhesion layer and a layer of gold. The thickness of the gold layer is increased to approximately 30,000 angstroms by electroplating. The ohmic contact is formed at the same time as the barrier contact. The second window, etched in the silicon dioxide layer at the same time as the central window, allows the ohmic contact metallization to touch the infrared shield structure. The infrared shield structure in turn makes ohmic contact to the cadmium sulfide substrate by virtue of its lower titanium adhesion layer. Gold lead wires are bonded to the top surfaces of the gold portions of the ohmic and barrier contacts by thermo-compression or thermosonic bonding.

BRIEF DESCRIPTION OF THE DRAWINGS

FIGS. 1–9 are a series of vertical cross sectional views illustrating the various stages of construction of a UV detector in accordance with a first embodiment of the present invention.

DESCRIPTION OF THE PREFERRED EMBODIMENTS

Figure 8:
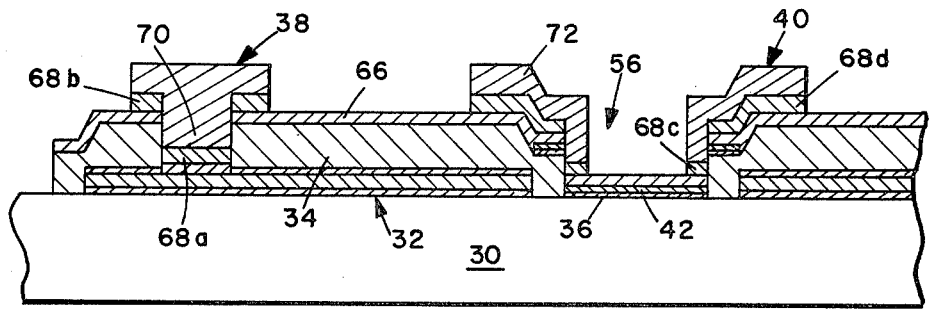
Figure 9:
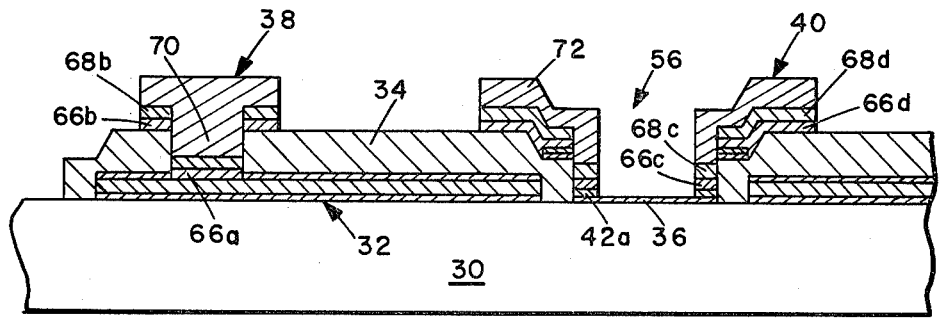
Figure 10:
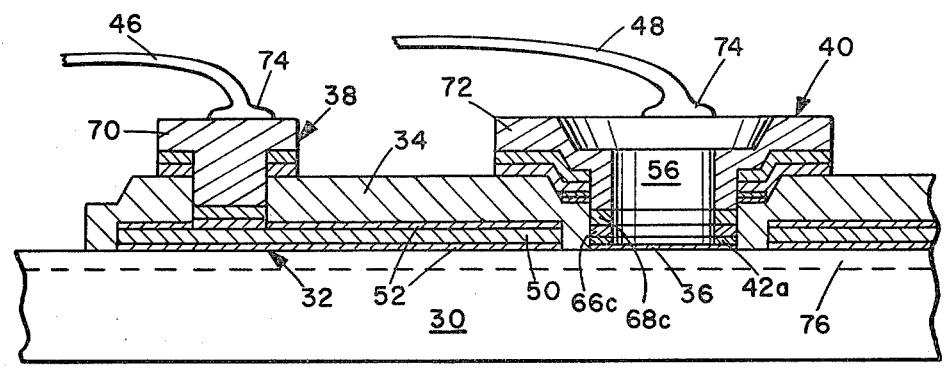
FIGS. 10A and 10B are vertical cross sectional and top planar views respectively of the completed UV detector constructed as shown in FIGS. 1–9. These views also illustrate the manner of attachment of the gold lead wires to the barrier and ohmic contacts.
Figure 10B:
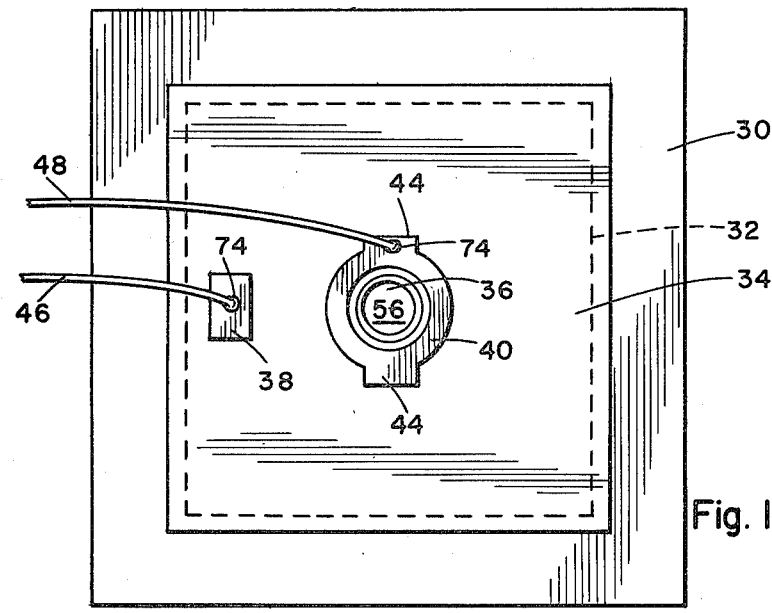

A first embodiment of the present invention is shown in various stages of construction in FIGS. 1–9, 10A and 10B. The overall configuration of the detector is best seen in FIG. 10B. It includes a flat square of cadmium sulfide substrate 30 having a small square shaped infrared shield structure 32 deposited directly thereon and having an outer perimeter indicated in phantom lines. An insulating layer 34 of silicon dioxide covers the IR shield structure. A thin Schottky barrier metal layer 36 is deposited directly onto the cadmium sulfide substrate in a central optically active area surrounded by the insulated IR shield structure. Ohmic and barrier contacts 38 and 40 respectively touch the IR shield structure and a boundary layer ring 42a (FIG. 10A) overlying the periphery of the layer 36 through separate windows in the silicon dioxide insulating layer. As shown in FIGS. 10A and 10B, the barrier contact 40 has a substantially cylindrical configuration. It extends within the central window of the insulating layer, leaving a major portion of the Schottky layer 36 exposed. A pair of lands 44 extend from opposite sides of the ring. Gold wire leads 46 and 48 are attached to the ohmic and barrier contacts 38 and 40, respectively, the lead 48 being attached to one of the lands 44 of the barrier contact.

It should be born in mind that the detector illustrated in FIGS. 10A and 10B is a microelectronic device. By way of example, the insulating layer 34 may measure 0.038 inches on a side and the uncovered portion of the Schottky barrier metal layer 36 may have a diameter measuring 0.004 inches. Throughout the figures the relative dimensions of the various layers are distorted in order to facilitate an easier understanding of the structure of the embodiments shown. Also in FIGS. 2–9 and 12–19, elevations of the various layers have not been indicated in the central window for the sake of clarity.

Turning now to FIGS. 1–9 and 10A, the monolithic architecture of the first embodiment and the process by which it is formed will now be described in detail. It will be understood that a plurality of the detectors are simultaneously produced on a single semiconductor wafer in a suitable array such as a 5×5 matrix. A wafer of suitable thickness, e.g. 1 millimeter, is sliced from a single crystalline cadmium sulfide ingot such as is available from Eagle-Picher or Cleveland Crystals Company. Such material is designated as being of the N-type with a resistivity of 1–20 ohm-cm, a carrier concentration of $10^{15}$–$10^{16}$ cm$^{-3}$, and a carrier mobility of at least 200 cm$^2$-v$^{-1}$sec$^{-1}$. The preferred orientation for slicing the wafer is such that the c-axis of the hexagonal crystal is perpendicular to the surface of the wafer as shown in FIG. 1. The wafer forms the cadmium sulfide substrate 30 of the detector. Hereafter the reference numeral 30 will be used interchangeably to refer to the wafer and the substrate. The wafer is etched in a solution of hydrochloric acid to identify the positive and negative orientation sides of the wafer, i.e. the sulfer-rich and cadmium-rich sides respectively (see FIG. 1).

The wafer 30 is mounted on a work fixture and lapped flat to a suitable thickness, for example approximately 0.020 to approximately 0.030 inches. The thickness of the cadmium sulfide substrate 30, i.e. the thickness of the wafer, can be varied considerably beyond this range without affecting the photovoltaic characteristics of the detector. In order to accomplish the lapping, the wafer may be mounted on a lapping holder and placed on a conventional rotating steel lapping plate. A lapping slurry, such as 5 micron alumina powder in MICRO OIL No. 1, may be applied every 30 seconds. The wafer can be lapped on both sides to obtain parallel surfaces, and lapping continues until the desired thickness is obtained.

Following the lapping operation, the wafer is polished using a felt-type polishing cloth on a rotating wheel. Initial polishing is performed with a 1 micron diamond polishing compound, followed by a final polishing with ¼ micron polishing compound. Preferably, the work fixture utilized to perform the polishing is cleaned between polishing operations to prevent contamination by the previously used abrasive. It will be understood that the various layers of the detector are deposited only on the upper surface thereof. The lower surface lapping and polishing operations therefore need not be performed.

The final wafer preparation involves the use of an etch-polish which removes non-single-crystal cadmium sulfide from the upper surface of the wafer and gives this surface a smooth, mirror-like finish which is essentially free of damage. A wheel with sidewalls is employed to retain an etch-polish solution whose active ingredient is nitric acid or hydrochloric acid. After etch-polishing the wafer is rinsed, cleaned and dried.

After the wafer 30 has been prepared, it is mounted on a carrier, which is typically a glass slide measuring $1 \times 1 \times 0.032$ inches in order to facilitate handling. The glass slide carrying the wafer is placed in a conventional vacuum deposition apparatus. Hereafter, the discussion will center around the formation of a single detector on top of the cadmium sulfide wafer, it being understood that a plurality of such detectors are simultaneously formed at various spaced apart locations on top of the wafer.

In the vacuum deposition apparatus, various layers of material are deposited on top of the cadmium sulfide substrate 30 in order to form the infrared shield structure 32 (FIG. 2). The deposition temperatures may range from approximately 20° C. to approximately 275° C. depending upon the type of metal being deposited. The infrared shield structure is formed on the upper surface of the cadmium sulfide substrate which is chosen so that it is the cadmium-rich side of the wafer. Preferably, the infrared shield structure is composed of a layer 50 of gold which is opaque to infrared radiation, sandwiched between two thin layers 52 of an adhesion metal. The layer of gold may be approximately 500 angstroms to approximately 10,000 angstroms thick. Preferably, when the layer 50 is made of gold, it is approximately 1,500 angstroms thick. The adhesion metal is preferably titanium but it also may be aluminum, magnesium, zirconium, hafnium, or alloys of various combinations thereof. Preferably, the layer of gold is sandwiched between two relatively thin layers of titanium which may each measure approximately 50 angstroms to approximately 5,000 angstroms in thickness, and which preferably each measure 300 angstroms in thickness.

Conventional photolithographic techniques are employed so that the three layers of metal which comprise the infrared shield structure have an identical square shape and a central, round window 54 (FIG. 2) which will be the optically active region through which the infrared radiation can pass.

After delineation of the infrared shield structure, the wafer is placed in a sputtering apparatus and a layer of silicon dioxide is deposited in order to form the insulating layer 34 (FIG. 3). One suitable sputtering apparatus is manufactured by Balzer's High Vacuum Company. The silicon dioxide insulating layer covers the infrared shield structure and may have a thickness of approximately 500 to approximately 20,000 angstroms, and preferably has a thickness of approximately 5,000 angstroms.

Conventional photolithographic techniques are employed in order to obtain the desired insulating layer pattern. The insulating layer 34 (FIG. 10B) is generally square shaped, and has first and second windows therethrough. The first window 56 (FIG. 3) corresponds in location and overall shape to the first window 54 (FIG. 2) formed in the infrared shield structure 32, except that the window 56 is slightly smaller. In other words, the second central window 56 is coincident with and slightly smaller than, the first central window 54. Both have a round configuration. It will be noted that in FIGS. 2 and 3 the insulating layer 34 overlaps the inner edges of the infrared shield structure defining the window 54 and contacts the cadmium sulfide substrate 30. The second window 58 (FIG. 3) formed in the insulating layer 34 is spaced from the first window and receives the ohmic contact 38 (FIG. 10B) as later described. Etching the insulating layer 34 to obtain the window 58 results in the removal of a small portion of the upper one of the layers 52.

Sputtering causes damage to the upper surface of the cadmium sulfide substrate which can adversely affect the performance of the detector. This damage is removed by annealing the wafer at a suitable temperature for a predetermined time period, for example, 15 minutes at a temperature of approximately 275° C.

After annealing, a thin layer of photoresist is employed as a lift-off mask 60 (FIG. 4) for the Schottky barrier metallization. This lift-off mask covers the wafer except for the central window 56 and the inner shoulder 62 of the insulating layer 34. To form the lift-off mask, a photoresist layer may be deposited over the entire surface of the wafer. This layer is then masked in the regions where the photoresist is to remain and the central portion is exposed to ultraviolet light. The exposed photoresistive material is then developed and chemically dissolved away leaving the central window 56 and the shoulder 62 exposed.

After the formation of the lift-off mask, the wafer is placed in a conventional vacuum apparatus where two metallization layers are deposited over the entire surface of the wafer (not shown) by electron beam evaporation. The photoresist lift-off mask 60 is then dissolved by spraying a jet of acetone on the wafer surface. This also removes the two metallization layers except in the central window of the photoresist lift-off mask as shown in FIG. 5. In that Figure, the lower of these two metallization layers, a portion of which lies directly on top of the substrate 30, is the Schottky barrier metallization layer 36. The upper one of these two layers is the boundary layer 42. It is important that the entire exposed area of the substrate in the window 56 (FIG. 4) be covered by the layer 36. Therefore the lift-off mask is delineated to leave both the window 56 and the shoulder 62 uncovered. This results in the formation of a pair of ring shaped layers 36' and 42' (FIG. 5) on top of the shoulder 62. As hereafter explained the central portion of the boundary layer 42 is etched away and the periphery thereof (42a in FIG. 9) remains to prevent the barrier contact metallization from affecting the properties of the Schottky barrier formed at the junction between the metal layer 36 and the cadmium sulfide substrate 30.

The Schottky barrier metal layer 36 may be made of platinum, gold, iridium, or alloys of various combinations thereof. Preferably the layer 36 is made of platinum. The layer 36 must be sufficiently thin to be substantially transparent to both UV and IR radiation. For example, where the layer 36 is made of platinum it may have a thickness of approximately 5 angstroms to approximately 50 angstroms, and preferably 15 angstroms. The depth of the platinum is controlled to be within plus or minus 5 angstroms as determined by measurement with a Talystep I profilometer.

The boundary layer 42 may be made of gold, tungsten, nichrome, iridium, rehenium, paladium, rhodium, or alloys of various combinations of these. Preferably the layer 42 is made of gold and has a thickness of approximately 100 to approximately 300 angstroms. The layers 36 and 42 cannot both be made of the same metal in any case.

Next the wafer 30 is again placed in the vacuum apparatus where it is heated to a suitable temperature between approximately 20° C. to approximately 235° C., depending upon the type of ohmic and barrier contact metallization that will be utilized. Preferably the wafer is heated to approximately 175° C. Thereafter, approximately 50 angstroms to approximately 5000 angstroms, and preferably approximately 300 angstroms of a contact adhesion layer 66 (FIG. 6) are deposited over the entire surface of the wafer. Preferably this contact adhesion layer is made of titanium, although nichrome, chromium or tungsten can also be utilized. While still in the vacuum apparatus, a contact metallization layer 68 (FIG. 6) is deposited over the just deposited contact adhesion layer. This contact metallization layer may be made of gold or aluminum. Preferably the contact metallization layer 68 is made of gold and has a thickness of approximately 1000 to approximately 2000 angstroms.

The wafer is removed from the vacuum apparatus and it is coated over its entire surface with a layer of photoresist (not shown). A suitable reverse image is made in this photoresist layer so that a pair of contact pads 70 and 72 (FIG. 7) can be electroplated onto the wafer to complete the ohmic and barrier contacts 38 and 40, respectively, as shown.

The pad 70 completely fills the side window 58 and it has surfaces which are bonded to a pair of stepped layer portions 68a and 68b of the contact metallization layer 68. The pad 72 has a lower cylindrical portion positioned within the central window 36 and an upper annular portion. These portions of the pad 72 have surfaces which are bonded to a pair of stepped layer portions 68c and 68d of the layer 68.

The pads 70 and 72 are made of the same type of metal as the contact metallization layer 68. Preferably they are made of gold which is built up by electroplating until the combined thickness of the pad 70 and the layer portion 68a or of the pad 72 and the layer portion 68c is approximately 50,000 angstroms.

After the aforementioned electroplating, the photoresist is removed and the portions of the contact metallization layer 68 which are not underneath the electroplated pads 70 and 72 are etched away as shown in FIG. 8. Next the portions of the contact adhesion layer 66 which are not underneath the pads 70 and 72 are etched away as shown in FIG. 9. This leaves the ohmic and barrier contacts 38 and 40 isolated from each other. Thus, viewing FIGS. 8 and 9 together, it can be seen that the completed ohmic contact 38 consists of the layer portions 66a, 66b, 68a and 68b and the pad 70. Likewise the completed barrier contact 40 consists of the layer portions 66c, 66d, 68c and 68d and the pad 72. Finally, the portion of the boundary layer 42 (FIG. 8) which is not beneath the pad 72 is etched away to expose the Schottky barrier metal layer 36 as shown in FIG. 9. The remaining boundary layer ring 42a (FIG. 9) of the boundary layer overlies the periphery of the Schottky layer 36. It prevents the contact adhesion layer portion 66c which is preferably titanium, from affecting the properties of the Schottky barrier formed between the layer 36 and the cadmium sulfide substrate 30. The boundary layer ring 42a is not absolutely necessary and may be eliminated where the contact adhesion layer 66 is made of a metal that will not form an ohmic type contact between the layer 66c and the Schottky barrier metal layer 36.

Next the wafer is mounted face down on a work fixture suitable for lapping so that the unprocessed lower surface of the wafer is facing upwardly. It is necessary to prevent damage to the various layers of material that have been deposited on the upper surface of the wafer. Therefore, a quantity of wax is applied to the work fixture to prevent the detector from contacting the metal portions of the lapping fixture. The lower side of the wafer is lapped to a suitable thickness, such as 0.006 inches and the lower surface is polished as previously described in conjunction with the lapping and polishing of the upper surface. It will be understood that the lower surface lapping and polishing operations are necessary only where layers are to be deposited on the same, for example, in the formation of ohmic contacts on the lower surfaces of the cadmium sulfide substrate, or when the device is to be used in a sandwich-type detector. Furthermore, the final thickness of the substrate is not critical. It's ultimate thickness is limited only in the sense that it is desired to have the finished detector configured in the form of a relatively flat chip.

After the lower surface of the wafer has been lapped and polished, the wafer is demounted from the work fixture, cleaned and dried. Suitable cleaning and drying steps are disclosed in U.S. Pat. No. 4,000,502. The detector is checked for pinholes in the infrared shield structure 32. The existance of such pinholes is undesirable since they allow extraneous radiation through the cadmium sulfide substrate at locations other than the central window 56. This will interfere with the proper operation of an infrared sensor positioned below the cadmium sulfide substrate when the detector is used in a UV/IR sandwiched configuration.

The wafer is mounted onto a pedestal and it is diced into individual detectors using a suitable saw and abrasive slurry. One suitable saw is manufactured by South Bay Technology. It incorporates a blade having a diameter measuring approximately 0.005 inches. The abrasive slurry may consist of 5 micron alumina powder in glycerol and water.

Finally, the gold wire leads 46 and 48 (FIG. 10A) are attached to the ohmic and barrier contacts 38 and 40, respectively, by thermo-compression or thermosonic bonding. Apparatuses are commercially available for attaching the leads in this manner at high speed, and this high speed bonding is facilitated by having both the ohmic and barrier contacts on the same side of the substrate. No conductive epoxy need be applied to affix leads to the respective contacts. The thermo-compression bonding technique results in the formation of mushroom-like lobes 74 at the ends of the wires which are firmly bonded to the gold contact pads 70 and 72, assuming gold has been utilized as the contact metallization. In FIG. 10A, the elevations of the layers 42a, 66c and 68c surrounding the central window 56 are depicted.

The foregoing process by which the various layers of the detector are built up results in the formation of a compensated layer 76 (FIG. 10A) adjacent the upper surface of the substrate 30. It's lower planar boundary is indicated by the phantom line in FIG. 10A. This compensated layer forms an avalanche region which protects the detector when excessive voltage is applied to it. This may occur when static electricity discharges from a person into the device through attached contacts such as probes, headers, etc. An unprotected detector can develop a potential difference of hundreds of volts across the insulating layer 34. Such a voltage potential can induce dielectric breakdown in the insulating layer which can cause permanent damage to the detector. The compensated layer 76 allows the electric field within the cadmium sulfide substrate to build up faster than it does in the insulating layer. When the electric field in the cadmium sulfide substrate exceeds a certain threshold level, a conductor path within the semiconductor substrate is formed by virtue of an avalanche effect. When the potential voltage is discharged, the current flow ceases and no permanent damage results to the detector.

Figure 11:
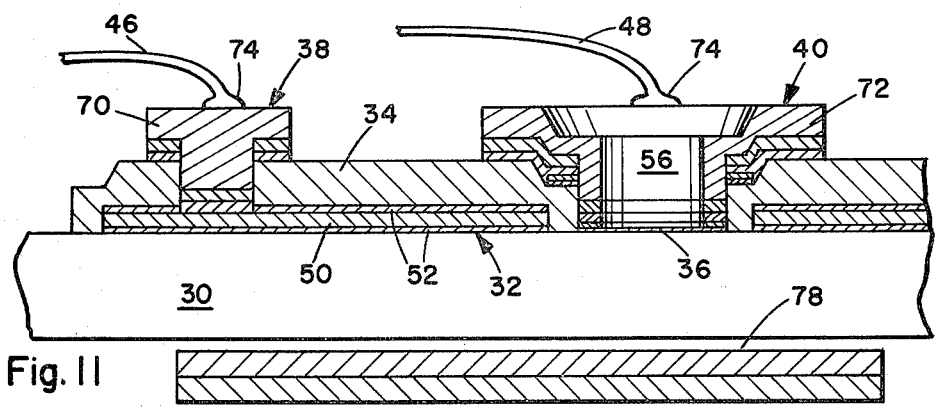
FIG. 11 is a vertical cross sectional view of a UV/IR detector sandwich constructed in accordance with a second embodiment of the present invention.
Figure 12:
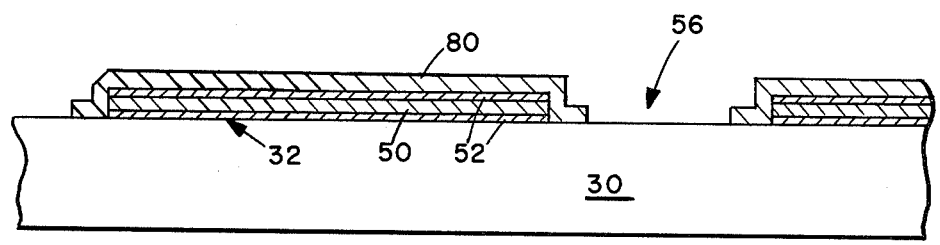
FIGS. 12–19 are a series of vertical cross sectional views which together with FIGS. 1 and 2 show the various stages of construction of a UV detector in accordance with a third embodiment of the present invention.

FIG. 11 depicts a second embodiment of the present invention in the form of a UV/IR detector sandwich. The upper portion of this detector is the first embodiment of the UV detector of FIGS. 10A and 10B just described. The lower portion of this UV/IR detector is an IR sensor 78 in the form of a suitable P-N junction photovoltaic diode. One suitable diode uses indium antimonide semiconductor materials. Preferably, the IR sensor 78 is spaced closely adjacent to the lower surface of the UV detector. In other words, the P and N semiconductor materials which form the IR sensor are not directly bonded to the lower surface of the cadmium sulfide substrate of the UV detector. The infrared shield structure 32 of the UV detector preferably extends beyond the side edges of the IR sensor 78 so that this sensor receives IR radiation only through the central window 56 of the UV detector.

Silicon dioxide has been known to exhibit poor bonding characteristics in conjunction with some cadmium sulfide surfaces. The third embodiment of the present invention represented by FIGS. 12-20 overcomes this problem and thereby insures the reliability of the insulating layer. Throughout FIGS. 1-21, like parts are indicated with like reference numerals except where otherwise stated. The initial steps of the process for forming the third embodiment are the same as those explained in conjunction with FIGS. 1 and 2. After the infrared shield structure 32 has been formed, the wafer is placed into a sputtering apparatus where it is preheated, and a first relatively thin layer 80 of silicon dioxide (FIG. 12) measuring approximately 1000 angstroms in thickness is deposited so that it covers the entire surface of the wafer. This layer is then patterned using photolithographic techniques to produce the first window 56, previously described in conjunction with the first embodiment. Again, damage caused to the cadmium sulfide substrate as a result of the sputtering process is removed by annealing the wafer for approximately 15 minutes at a temperature of approximately 275° C.

Figure 13:
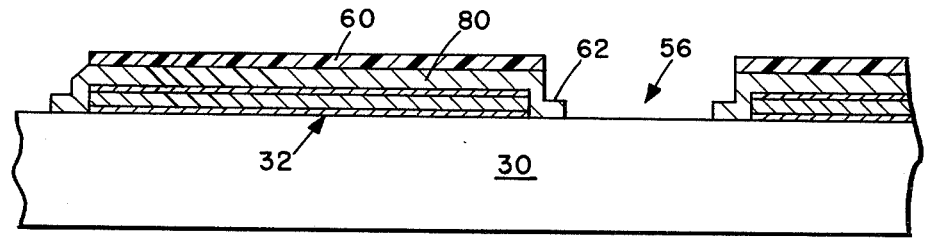
Figure 14:
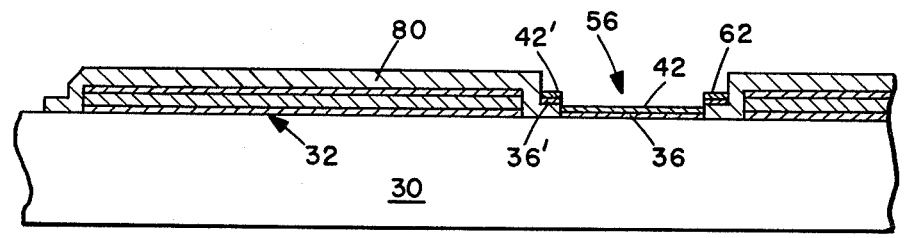
Figure 15:
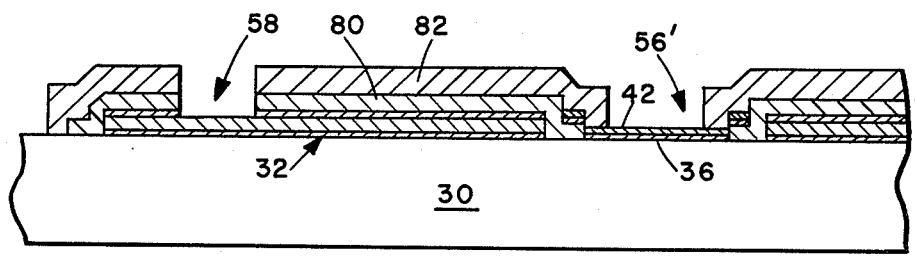
Figure 16:
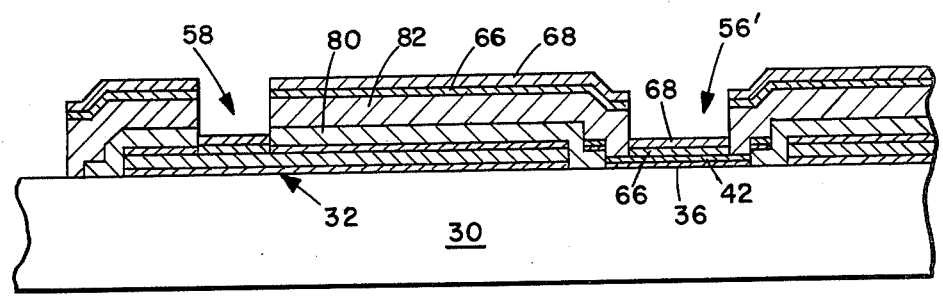

After annealing, the Schottky barrier metal layer 36 and the boundary metallization layer 42 are deposited and delineated as shown in FIGS. 13 and 14, the process steps being similar to those described in conjunction with FIGS. 4 and 5.

Next the wafer is again placed into the sputtering apparatus and a second relatively thick layer 82 of silicon dioxide (FIG. 15) measuring approximately 4000 angstroms in thickness is deposited on top of the first layer of silicon dioxide 80. Photolithographic techniques are again employed in order to delineate the second insulating layer 82 to provide the first and second windows 56 and 58. This time, however, the second layer of silicon dioxide is delineated to provide a slightly smaller active area window 56' than that etched in the first layer of silicon dioxide 80. A single etching step removes portions of both the insulating layers 80 and 82 and of the upper one of the layers 52 to provide the window 58.

Figure 6:
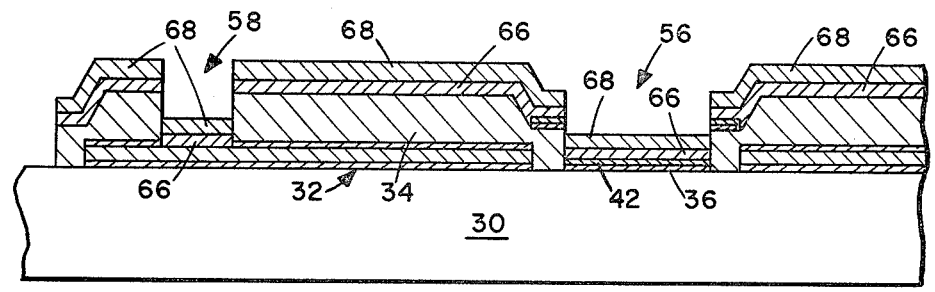
Figure 7:
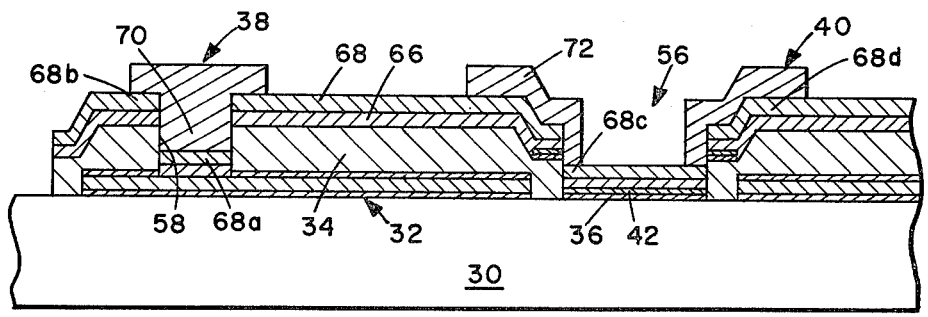
Figure 17:
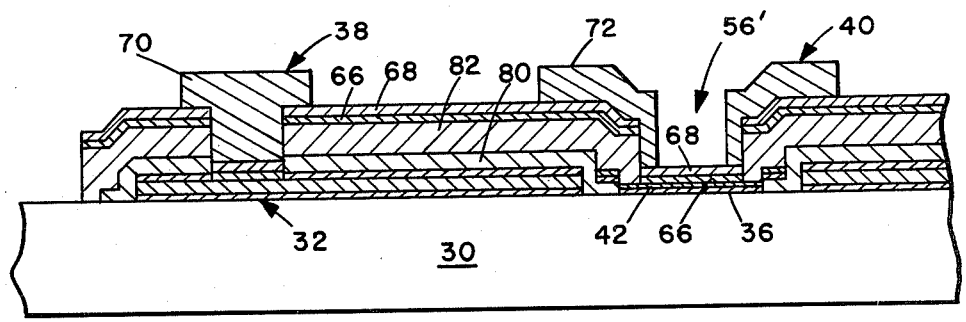
Figure 18:
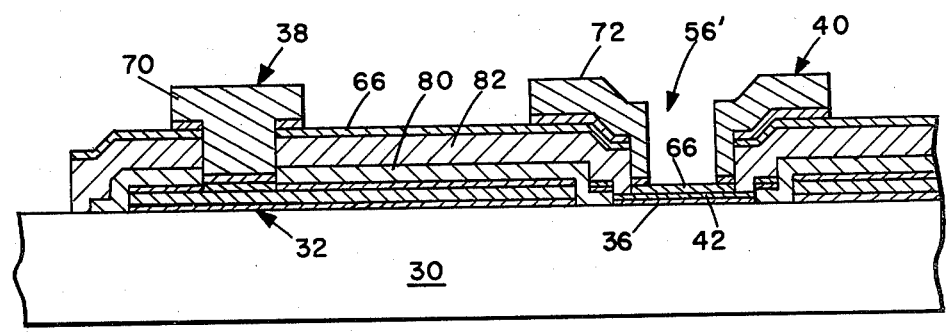
Figure 19:
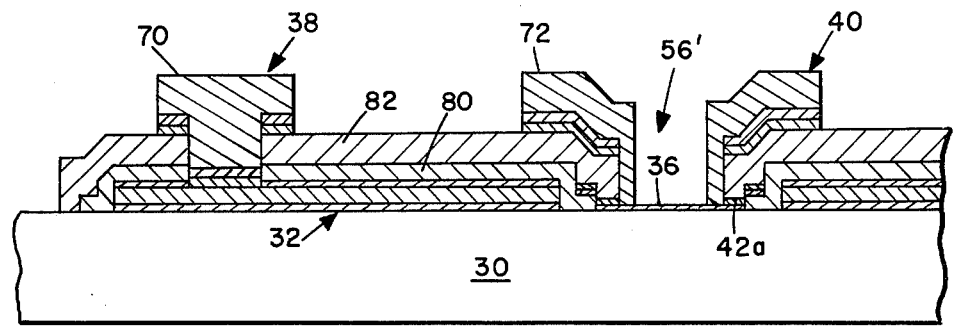

The contact adhesion layer 66 and the contact metallization layer 68 are deposited on top of the wafer (FIG. 16) in a similar manner as previously described in conjunction with FIG. 6 of the first embodiment. The contact pads 70 and 72 are built up by electroplating as shown in FIG. 17. And in a similar fashion to the first embodiment, the portions of the layers 66 and 68 which are not under the contact pads 70 and 72 are successively etched away as shown in FIGS. 18 and 19. This isolates the ohmic and barrier contacts 38 and 40 from each other. And as shown in FIG. 19 the exposed portion of the boundary layer 42 is etched away in the central window 56 leaving the boundary layer ring 42a.

Figure 20:
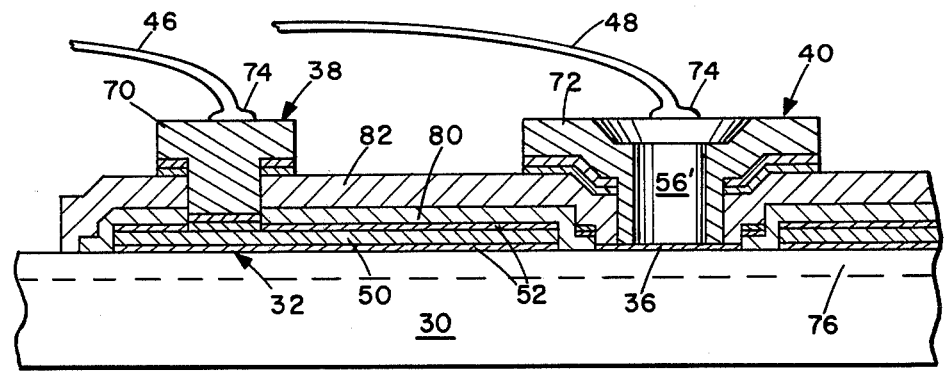
FIG. 20 is a vertical cross sectional view of the completed UV detector constructed in accordance with FIGS. 1, 2, and 12–19. This view shows the gold lead wires attached to the ohmic and barrier contacts.

Finally, as shown in FIG. 20, the gold wire leads 46 and 48 are attached to the ohmic and barrier contacts 38 and 40, respectively, by thermo-compression or thermosonic bonding as was done with the first embodiment. Lower surface processing of the wafer, sawing of the wafer into individual detector units, and final testing of each individual detector may then be accomplished as summarized in connection with the first embodiment.

Figure 21:
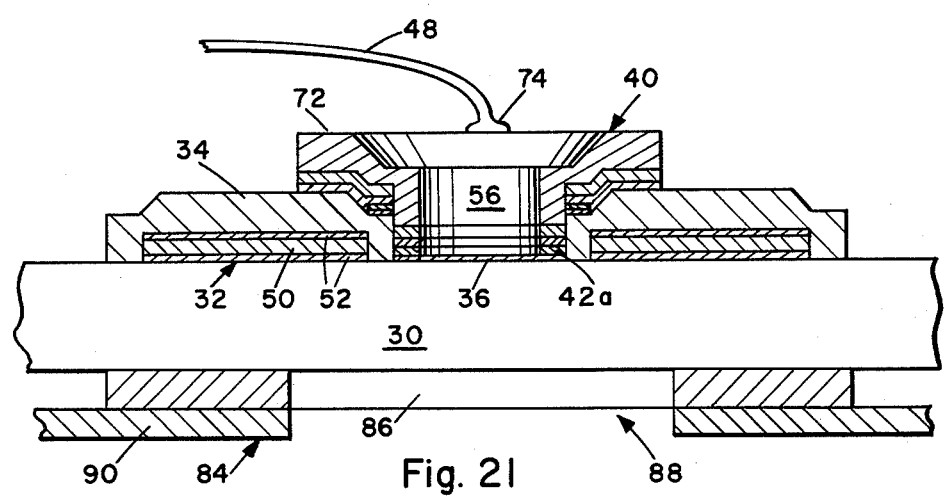
FIG. 21 is a vertical cross sectional view of a completed UV detector constructed in accordance with a fourth embodiment of the present invention.

In some mounting configurations, it may be desirable to produce a fourth embodiment of the UV detector of the present invention as shown in FIG. 21. It has it's barrier contact 40 on the top surface of the cadmium sulfide substrate and its ohmic contact 84 on the lower surface of the substrate. This detector is constructed the same as the first embodiment in every respect except for the location of the ohmic contact. First, the various layers of metal are built up on the upper surface of the substrate. Thereafter the lower surface of the substrate is lapped and polished as previously described. Then, the ohmic contact 84 is built up on the lower surface. It may consist of a layer of indium 86 measuring approximately 2,000 angstroms in thickness and having a circular IR window 88 formed therein by photolithographic techniques. This IR window may have a diameter of suitable dimension, e.g. 0.011 inches so that substantially all of the incident infrared radiation passing through the exposed portion of the Schottky barrier metal layer 36 and the cadmium sulfide substrate will pass therethrough to an IR sensor (not shown). The lower surface of the indium layer 86 may be bonded directly to a conductive mounting 90.

Having described preferred embodiments of the present invention, it will be apparent to those skilled in the art that the invention permits modification in both arrangement and detail. Therefore, the present invention should be limited only in accordance with the scope of the following claims.

We claim:

1. A Schottky barrier photovoltaic detector comprising:
   a cadmium sulfide substrate having upper and lower surfaces;
   an infrared shield structure overlying the upper surface of the substrate, including a layer of gold sandwiched between two layers of titanium, the shield structure being delineated to provide a first central window therein;
   in insulating layer covering the infrared shield structure and having a second central window and a side window therein, the second central window being coincident with and slightly smaller than the first central window;

a Schottky barrier metallization layer positioned within the second central window and completely covering the portion of the substrate which is located therein, the Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed; and means positioned above the upper surface of the substrate for providing an ohmic contact extending through the side window.

2. A Schottky barrier photovoltaic detector comprising:

a cadmium sulfide substrate having upper and lower surfaces;

an infrared shield structure overlying the upper surface of the substrate, including a layer of a material which is substantially opaque to infrared radiation, the shield structure being delineated to provide a first central window therein;

an insulating layer covering the infrared shield structure and having a second central window and a side window therein, the second central window being coincident with and slightly smaller than the first central window;

a Schottky barrier metallization layer positioned within the second central window and completely covering the portion of the substrate which is located therein, the Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed;

means positioned above the upper surface of the substrate for providing an ohmic contact extending through the side window; and the barrier contact means and the ohmic contact means each including a lower contact adhesion layer made of titanium and an upper contact pad made of gold.

3. A Schottky barrier photovoltaic detector comprising:

a cadmium sulfide substrate having upper and lower surfaces;

an infrared shield structure overlying the upper surface of the substrate, including a layer of a material which is substantially opaque to infrared radiation, the shield structure being delineated to provide a first central window therein;

an insulating layer covering the infrared shield structure and having a second central window and a side window therein, the second central window being coincident with and slightly smaller than the first central window;

a Schottky barrier metallization layer positioned within the second central window and completely covering the portion of the substrate which is located therein, the Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed;

means positioned above the upper surface of the substrate for providing an ohmic contact extending through the side window; and a boundary layer positioned between the barrier contact means and the Schottky barrier metallization layer, the boundary layer being made of a material that prevents the barrier contact means from affecting the properties of the Schottky barrier formed by the junction of the substrate and the Schottky barrier metallization layer.

4. A Schottky barrier photovoltaic detector comprising:

a cadmium sulfide substrate having upper and lower surfaces;

an infrared shield structure overlying the upper surface of the substrate, including a layer of gold sandwiched between two layers of a material selected from the group consisting of titanium, aluminum, magnesium, zirconium and hafnium, the shield structure being delineated to provide a first central window therein;

an insulating layer covering the infrared shield structure and having a second central window and a side window therein, the second central window being coincident with and slightly smaller than the first central window;

a Schottky barrier metallization layer positioned within the second central window and completely covering the portion of the substrate which is located therein, the Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed; and means positioned above the upper surface of the substrate for providing an ohmic contact extending through the side window.

5. A Schottky barrier photovoltaic detector comprising:

a cadmium sulfide substrate having upper and lower surfaces;

an infrared shield structure overlying the upper surface of the substrate, including a layer of a material which is substantially opaque to infrared radiation, the shield structure being delineated to provide a first central window therein;

an insulating layer covering the infrared shield structure and having a second central window and a side window therein, the second central window being coincident with and slightly smaller than the first central window;

a Schottky barrier metallization layer positioned within the second central window and completely covering the portion of the substrate which is located therein, the Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed;

means positioned above the upper surface of the substrate for providing an ohmic contact extending through the side window; and a boundary layer positioned between the barrier contact means and the Schottky barrier metallization layer, the boundary layer being made of a material selected from the group consisting of gold, tungsten, nichrome, iridium, rhenium, paladium and rhodium.

6. A Schottky barrier photovoltaic detector comprising:

a cadmium sulfide substrate having upper and lower surfaces;

an infrared shield structure overlying the upper surface of the substrate, and including a layer of gold sandwiched between two layers of titanium, the layers of the infrared shield structure being delineated to provide a first central window therein;

an insulating layer made of silicon dioxide covering the infrared shield structure and having a second central window;

a Schottky barrier metaliization layer made of platinum positioned within the second central window and completely covering the portion of the upper surface of the substrate which is located therein, the platinum Schottky barrier metallization layer being sufficiently thin so that it is substantially transparent to ultraviolet and infrared radiation;

means positioned above the upper surface of the substrate for providing a barrier contact extending through the second central window and leaving a major portion of the Schottky barrier metallization layer exposed; and means positioned below the lower surface of the substrate for providing an ohmic contact and a third central window while permitting substantially all of the infrared radiation which passes through the platinum Schottky barrier metallization layer and the substrate to pass through the ohmic contact means.

* * * * *

UNITED STATES PATENT AND TRADEMARK OFFICE
CERTIFICATE OF CORRECTION

PATENT NO. : 4,319,258
DATED : March 9, 1982
INVENTOR(S) : Gary L. Harnagel et al It is certified that error appears in the above-identified patent and that said Letters Patent are hereby corrected as shown below:

In column 10, line 67, delete "in" and insert therefor --an--.

Signed and Sealed this

Twenty-seventh Day of July 1982

[SEAL]

Attest:

GERALD J. MOSSINGHOFF

Attesting Officer

Commissioner of Patents and Trademarks